(12) United States Patent
Lin et al.

(10) Patent No.: US 8,476,664 B2
(45) Date of Patent: Jul. 2, 2013

(54) LIGHT EMITTING DIODE PACKAGE HAVING MULTIPLE LUMINESCENT CONVERSION LAYERS

(75) Inventors: Hsin-Chiang Lin, Hsinchu (TW); Wen-Liang Tseng, Hsinchu (TW); Chieh-Ling Chang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/288,038

(22) Filed: Nov. 3, 2011

(65) Prior Publication Data

US 2012/0235192 A1    Sep. 20, 2012

(30) Foreign Application Priority Data

Mar. 15, 2011    (CN) .......................... 2011 1 0061308

(51) Int. Cl.
*H01L 33/00* (2010.01)
*H01L 27/15* (2006.01)

(52) U.S. Cl.
USPC .................... 257/98; 257/99; 257/79; 257/81; 257/100

(58) Field of Classification Search
None
See application file for complete search history.

(56) References Cited

U.S. PATENT DOCUMENTS

| | | | |
|---|---|---|---|
| 2003/0038295 A1* | 2/2003 | Koda | 257/98 |
| 2004/0217692 A1* | 11/2004 | Cho et al. | 313/503 |
| 2007/0287208 A1* | 12/2007 | Thompson et al. | 438/26 |
| 2009/0057698 A1* | 3/2009 | Okamura et al. | 257/98 |
| 2009/0267484 A1* | 10/2009 | Kasakura et al. | 313/502 |
| 2011/0204400 A1* | 8/2011 | Koizumi et al. | 257/98 |

* cited by examiner

*Primary Examiner* — Julio J Maldonado
*Assistant Examiner* — Harpreet Singh
(74) *Attorney, Agent, or Firm* — Altis Law Group, Inc.

(57) ABSTRACT

A light emitting diode package comprises a light emitting diode chip, a first luminescent conversion layer and a separate second luminescent conversion layer on the first luminescent conversion layer. The first luminescent conversion layer has a first luminescent conversion element surrounding the light emitting diode chip. The second luminescent conversion layer has a second luminescent conversion element located above the light emitting diode chip. An excitation efficiency of the first luminescent conversion element is higher than that of the second luminescent conversion element.

15 Claims, 2 Drawing Sheets

LIGHT EMITTING DIODE PACKAGE HAVING MULTIPLE LUMINESCENT CONVERSION LAYERS

TECHNICAL FIELD

The disclosure relates generally to light emitting diode packages, and more particularly to a light emitting diode package having multiple luminescent conversion layers.

DESCRIPTION OF THE RELATED ART

Light emitting diodes are popular due to low power consumption, high efficiency, quick reaction time, long life and the absence of mercury. To emit light with multiples wavelengths, light emitting diode packages may comprise one light emitting chip to excite multiple luminescent conversion elements simultaneously. For example, there may be one chip emitting blue light, one green luminescent conversion element and one red luminescent conversion element mixed within an encapsulation. However, different luminescent conversion elements have different excitation efficiencies. If various luminescent conversion elements are assembled in one package at the same time and are excited by one light source, the luminescent conversion elements may adversely influence each other, leading to lack of color uniformity and reduced ability to render colors.

DETAILED DESCRIPTION

Exemplary embodiments of the disclosure will now be described with reference to the accompanying drawings.

Figure 1:
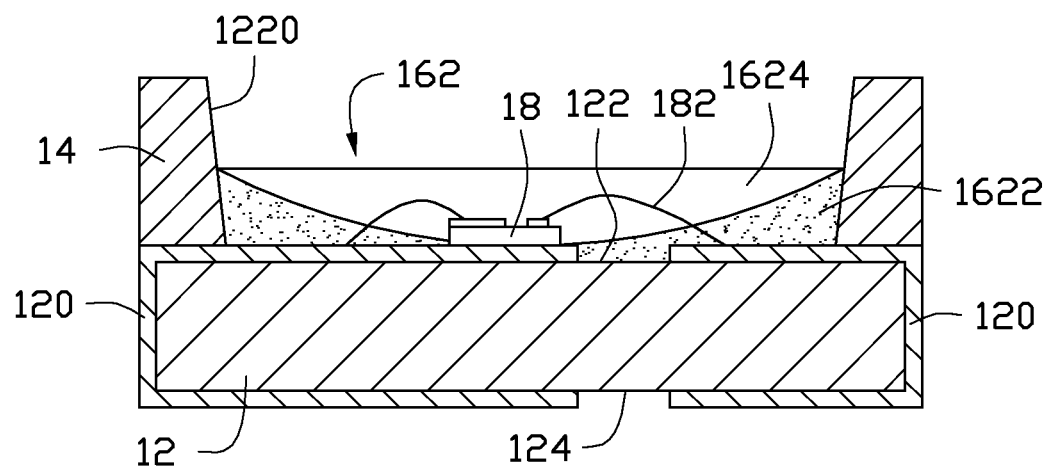
FIG. 1 is a cross section showing a semi-finished product of a light emitting diode package of the disclosure which has a first luminescent conversion layer.
Figure 2:
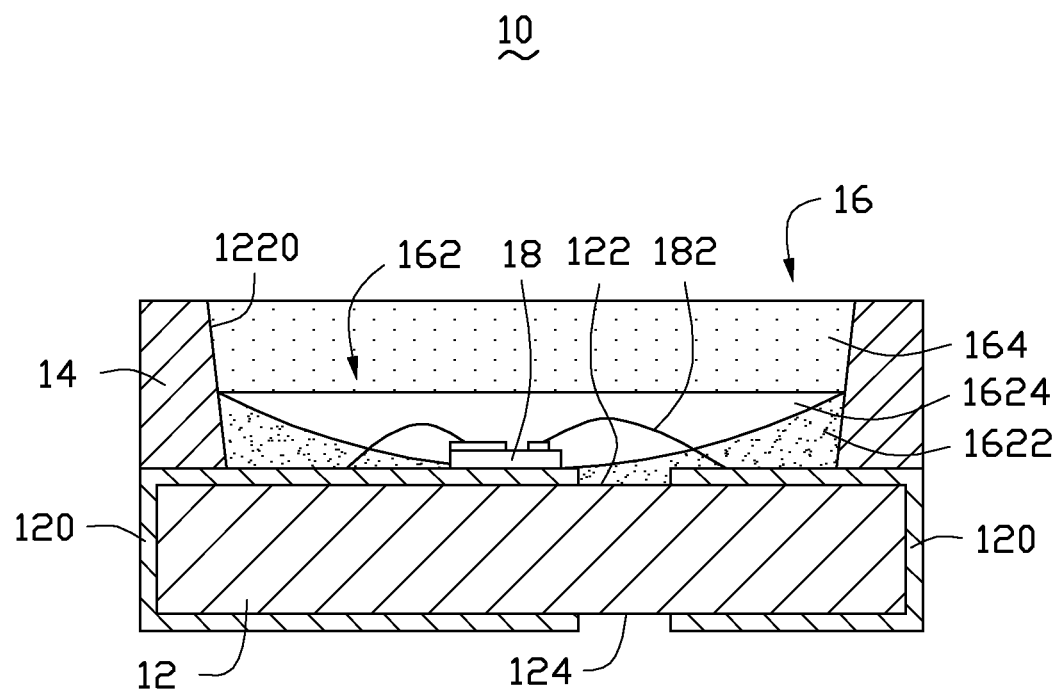
FIG. 2 is a cross section showing a completed light emitting diode package of the disclosure which has a second luminescent conversion layer added to the semi-finished product of FIG. 1.

Referring to FIG. 1 and FIG. 2, the disclosure provides a light emitting diode package 10 comprising a substrate 12, a reflector 14, an encapsulation layer 16 and a light emitting diode chip 18.

The substrate 12 comprises a top surface 122, a bottom surface 124 opposite to the top surface 122 and two electrodes 120 located on the top surface 122 and extending to the bottom surface 124 via lateral surfaces (not labeled) of the substrate 12. The two electrodes 120 comprise a cathode and an anode respectively. The reflector 14 is located on the top surface 122 and defines a depression 1220 around the fringe of the substrate 12.

The light emitting diode chip 18 is disposed inside the depression 1220 and electrically connects to the two electrodes 120 via two conductive wires 182. Light emitted from the light emitting diode chip 18 in an upward direction is more intense than light emitted in other directions. The remaining light is collected by the reflector 14 and is directed upward, whereby the light intensity from the light emitting diode package 10 is enhanced. In the first embodiment, the light emitting diode chip 18 is capable of emitting blue light.

The encapsulation layer 16 contains a first luminescent conversion layer 162 and a second luminescent conversion layer 164, both of which cover the light emitting diode chip 18. Moreover, the first luminescent conversion layer 162 comprises a first luminescent conversion element 1622 and a first transparent colloid 1624 above the first luminescent conversion element 1622. Further, the first luminescent conversion element 1622 is located on the bottom of the depression 1220 to form a concave dish surrounding the light emitting diode chip 18. In this embodiment, the first luminescent conversion element 1622 is a green luminescent conversion element selected from nitroxides such as $Si_xAl_y(ON)_z$, sulfides or silicates.

The second luminescent conversion layer 164 is on top of the first luminescent conversion layer 162. Moreover, the second luminescent conversion layer 164 comprises one second luminescent conversion element (not labeled) mixed with a second transparent colloid (not labeled), wherein the second luminescent conversion element is located above the light emitting diode chip 18. In this embodiment, the excitation efficiency of the second luminescent conversion element is lower than the first luminescent conversion element 1622. Specifically, the second luminescent conversion element is a red luminescent conversion element selected from nitrides, sulfides or silicates.

In the disclosure, the first luminescent conversion element 1622 is formed as the concave dish surrounding the base of the light emitting diode chip 18. However, light emitted from the light emitting diode chip 18 in the upward direction is more intense than in other directions, and the upward light directly excites the second luminescent conversion element through the first transparent colloid 1624. Since the excitation efficiency of the second luminescent conversion element is lower than the first luminescent conversion element 1622, the intensity of the light being excited from the second luminescent conversion element is substantially equal to that of the first luminescent conversion element 1622. Therefore, the light emitting diode package 10 has an enhanced ability to render colored light. In this embodiment, the light emitting diode chip 18 emits blue light, the first luminescent conversion element 1622 is a green luminescent conversion element and the second luminescent conversion element is a red luminescent conversion element, such that the light emitting diode package 10 can provide uniform blue, green and red light with an enhanced color rendering ability. Moreover, the excitation efficiencies of the luminescent conversion elements inside the depression 1220 are also increased since emitted light which does not directly excite the luminescent conversion element, is reflected back to the luminescent conversion element by the reflector 14.

A second embodiment of the disclosure is provided as follows, wherein the light emitting diode chip 18 emits ultraviolet, the first luminescent conversion element 1622 is a hybrid of blue and green luminescent conversion elements, and the second luminescent conversion element is a red luminescent conversion element. In this embodiment, the excitation efficiency of the red luminescent conversion element is lower than that of the hybrid of blue and green luminescent conversion element. The excitation efficiencies of the blue and the green luminescent conversion elements are similar. Thus, the light emitting diode package 10 in the second embodiment can provide a uniform blue, green and red light, with a high color rendering property at the same time.

Accordingly, the light emitting diode package 10 comprises two separate luminescent conversion layers, wherein the first luminescent conversion element 1622 inside the first luminescent layer 162 surrounds the base of the light emitting diode chip 18 to avoid direct excitation by light from the chip 18 being emitted in an upward direction. On the other hand, the upward light can directly excite the second luminescent conversion element through the first transparent colloid 1624.

The intensity of the light being excited from the second luminescent conversion element is substantially equal to that from the first luminescent conversion element 1622. Therefore, the light emitting diode package 10 provides an enhanced ability to render color and emits different colors of light uniformly.

It is to be understood, however, that even though numerous characteristics and advantages of the disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A light emitting diode package, comprising:
   a substrate, having a top surface, a bottom surface and two electrodes;
   a reflector, defining a depression located on the top surface;
   a light emitting diode chip, disposed inside the depression and electrically connecting to the two electrodes; and
   an encapsulation layer, having a first luminescent conversion layer and a second luminescent conversion layer disposed on the first luminescent conversion layer, wherein the first luminescent conversion layer comprises a first luminescent conversion element surrounding the light emitting diode chip and a first transparent colloid above the first luminescent conversion element and receiving the light emitting diode chip therein, wherein the first luminescent conversion element is located on a bottom of the depression and coated on top surfaces of the electrodes and extends from an outer periphery of the light emitting diode chip to an inner surface of the reflector, an inner end of the first luminescent conversion element surrounds and contacts the outer periphery of the light emitting diode chip, and an outer end of the first luminescent conversion element contacts the inner surface of the reflector, the first luminescent conversion element, the first transparent colloid, and the second luminescent conversion layer are arranged on the substrate in sequence from bottom to top.

2. The light emitting diode package as claimed in claim 1, wherein the two electrodes comprise a cathode and an anode respectively extending from the top surface to the bottom surface.

3. The light emitting diode package as claimed in claim 1, wherein the light emitting diode chip is capable of emitting blue light or ultraviolet, and electrically connects to the two electrodes via conductive wires respectively.

4. The light emitting diode package as claimed in claim 1, wherein the first luminescent conversion element comprises green or blue luminescent conversion element selected from nitroxides, sulfides or silicates.

5. The light emitting diode package as claimed in claim 1, wherein the second luminescent conversion element comprises a second transparent colloid mixed with a second luminescent conversion element.

6. The light emitting diode package as claimed in claim 5, wherein the excitation efficiency of the second luminescent conversion element is lower than that of the first luminescent conversion element.

7. The light emitting diode package as claimed in claim 6, wherein the second luminescent conversion element is a red luminescent conversion element selected from nitrides, sulfides or silicates.

8. The light emitting diode package as claimed in claim 5, wherein the second luminescent conversion element is located above the light emitting diode chip.

9. A light emitting diode package, comprising:
   a substrate, having a top surface, a bottom surface and two electrodes located on the top surface and extending to the bottom surface;
   a reflector, defining a depression located on the top surface;
   a light emitting diode chip, disposed inside the depression and electrically connecting to the two electrodes;
   a first luminescent conversion layer comprising a first luminescent conversion element surrounding the light emitting diode chip and a first transparent colloid above the first luminescent conversion element and receiving the light emitting diode chip therein, wherein the first luminescent conversion element is located on a bottom of the depression and coated on top surfaces of the electrodes and extends from an outer periphery of the light emitting diode chip to an inner surface of the reflector, an inner end of the first luminescent conversion element surrounds and contacts the outer periphery of the light emitting diode chip, and an outer end of the first luminescent conversion element contacts the inner surface of the reflector; and
   a second luminescent conversion layer disposed on the first luminescent conversion layer, the first luminescent conversion element, the first transparent colloid, and the second luminescent conversion layer are arranged on the substrate in sequence from bottom to top, the second luminescent conversion layer comprising a second luminescent conversion element, wherein an excitation efficiency of the second luminescent conversion element is lower than that of the first luminescent conversion element.

10. The light emitting diode package as claimed in claim 9, wherein the two electrodes comprise a cathode and an anode respectively.

11. The light emitting diode package as claimed in claim 9, wherein the light emitting diode chip is capable of emitting blue light or ultraviolet, and electrically connects to the two electrodes via conductive wires respectively.

12. The light emitting diode package as claimed in claim 9, wherein the second luminescent conversion layer comprises a second transparent colloid mixed with the second luminescent conversion element.

13. The light emitting diode package as claimed in claim 9, wherein the first luminescent conversion element comprises green or blue luminescent conversion element selected from nitroxides, sulfides or silicates.

14. The light emitting diode package as claimed in claim 10, wherein the second luminescent conversion element is a red luminescent conversion element selected from nitrides, sulfides or silicates.

15. The light emitting diode package as claimed in claim 9, wherein the second luminescent conversion element is located above the light emitting diode chip.

* * * * *